(12) United States Patent
Wang et al.

(10) Patent No.: US 7,132,303 B2
(45) Date of Patent: Nov. 7, 2006

(54) STACKED SEMICONDUCTOR DEVICE ASSEMBLY AND METHOD FOR FORMING

(75) Inventors: James J. Wang, Phoenix, AZ (US); Alan J. Magnus, Gilbert, AZ (US); Justin E. Poarch, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/739,605

(22) Filed: Dec. 18, 2003

(65) Prior Publication Data

US 2005/0136558 A1    Jun. 23, 2005

(51) Int. Cl.
*H01L 21/00* (2006.01)

(52) U.S. Cl. .................... 438/17; 257/E21.524

(58) Field of Classification Search ............... 438/15, 438/17, 18, 108, 117, 597, 612, 613, 614
See application file for complete search history.

(56) References Cited

U.S. PATENT DOCUMENTS

| | | |
|---|---|---|
| 4,104,111 A | 8/1978 | Mack |
| 5,258,648 A | 11/1993 | Lin |
| 5,291,061 A | 3/1994 | Ball |
| 5,739,588 A | 4/1998 | Ishida et al. |
| 6,165,815 A | 12/2000 | Ball |
| 6,177,731 B1 | 1/2001 | Ishida et al. |
| 6,212,767 B1 | 4/2001 | Tandy |
| 6,222,265 B1 | 4/2001 | Akram et al. |
| 6,229,158 B1 | 5/2001 | Minemier et al. |
| 6,337,225 B1 | 1/2002 | Foong et al. |
| 6,344,401 B1 | 2/2002 | Lam |
| 6,429,046 B1 | 8/2002 | Marlin |
| 6,494,361 B1 | 12/2002 | Scanlan et al. |
| 6,534,853 B1* | 3/2003 | Liu et al. .................... 257/692 |

OTHER PUBLICATIONS

Woerner, Holger; "Potential of Flip Chip Technologies for Chip Stacking Applications";. SMTA Conference, Sep. 2002; 6pp.
Edwards, Chris; "Solid Stackng Technique Removes Pinout Requirement"; EETimes (http://www.eet.com/story/OEG20020812S0004); Aug. 12, 2002; 3pp; EETimes.
Olsen, Dennis et al.: "Assembly of Silicon-on-Silicon Flip Chip Pairs in Conventional Semiconductor Packages"; Motorola Physical Electronics & Packaging Lab Technical Report No. PEPL 91-6; Jun. 17 1991.

* cited by examiner

*Primary Examiner*—Scott B. Geyer
(74) *Attorney, Agent, or Firm*—Joanna G. Chiu; Michael P. Noonan

(57) ABSTRACT

One embodiment relates to using a robust metal layer of a semiconductor device to form landing pads. In one embodiment, a sputterable, nonwettable refractory metal is used as a solder mask for the landing pads. A second device may then be coupled to the robust metal layer landing pads of the semiconductor device. In one embodiment, the landing pads are formed while the semiconductor device is in wafer form, and a second device is then coupled to the landing pads of each of the plurality of semiconductor devices within the wafer, such that each semiconductor device within the wafer is electrically coupled to a second device. In this manner, each semiconductor device within the wafer and its corresponding second device may be probed and tested as a system. After probing and testing, the wafer may be singulated into a plurality of individual device assemblies which may then be packaged.

30 Claims, 3 Drawing Sheets

STACKED SEMICONDUCTOR DEVICE ASSEMBLY AND METHOD FOR FORMING

FIELD OF THE INVENTION

The present invention relates generally to data processing systems, and more specifically, to semiconductor devices having landing pads capable of being coupled to other semiconductor devices.

RELATED ART

The ability to package multiple devices into a single package improves cost and performance by achieving higher functional integration with one package. However, current methods for stacking devices are costly in terms of manufacturing and testing. Therefore, an improved method for forming stacked semiconductor devices is needed.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

One embodiment of the present invention relates to using a robust metal layer (such as, for example, a power metal layer) of a semiconductor device to form landing pads. In one embodiment, a sputterable, nonwettable refractory metal is used as a solder mask for the landing pads. A second device may then be coupled to the robust metal layer landing pads of the semiconductor device. In one embodiment, the landing pads are formed while the semiconductor device is in wafer form, and a second device is then coupled to the landing pads of each of the plurality of semiconductor devices within the wafer, such that each semiconductor device within the wafer is electrically coupled to a second device. In this manner, each semiconductor device within the wafer and its corresponding second device, forming a device assembly, may be probed and tested as a system while still in wafer form. After probing and trimming, the wafer may be singulated into a plurality of individual semiconductor devices, each electrically coupled to a corresponding second device. These singulated device assemblies may then be packaged. In one embodiment, after formation of the landing pads from the robust metal layer, a stencil print and reflow process may be used to apply solder paste to the landing pads to form solder bumps such that the semiconductor device within the wafer may then be coupled to another device or to any other type of substrate.

Figure 1:
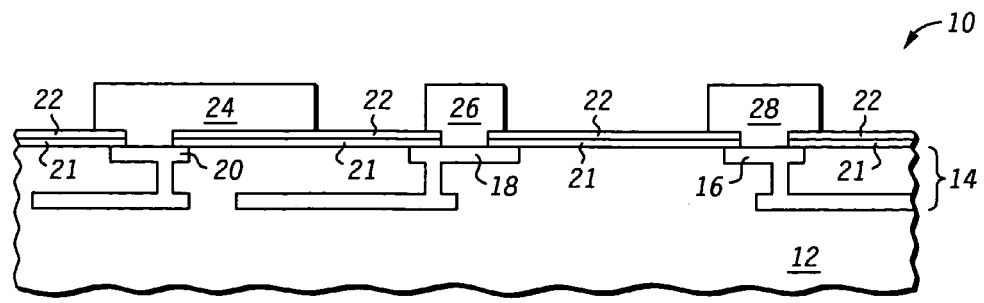
FIG. 1 illustrates a cross-sectional view of a semiconductor device having a passivation layer overlying a substrate, an organic layer overlying the passivation layer, and a robust metal layer overlying at least portions of the passivation layer, in accordance with one embodiment of the present invention.

FIG. 1 illustrates a semiconductor device 10 having an integrated circuit (IC) wafer 12 (where FIG. 1 illustrates a portion of IC wafer 12). Integrated circuit wafer 12 includes an interconnect region 14 which includes a plurality of metal layers for routing power, ground, signals, and other lines between various components of semiconductor device 10 within IC wafer 12. As illustrated in FIG. 1, interconnect region 14 includes a final metal layer including exposed metal portions 20, 18, and 16 (which may also be referred to as contacts 20, 18, and 16) positioned at a top surface of IC wafer 12. The metal layers of interconnect region 14 may be interconnected between each other using vias, as illustrated in FIG. 1. In one embodiment, the metal layers of interconnect region 14 are formed from conductive materials, such as, for example, aluminum, copper, or gold. In other embodiments, there may be more or less metal layers. In the illustrated embodiment, the metal layers of interconnect region 14, including exposed metal portions 20, 18, and 16, are formed of aluminum.

IC wafer 12 of semiconductor device 10 is subjected to conventional fabrication techniques for forming electrical circuits (not shown) in the active regions or substrate of IC wafer 12. The electrical circuits may be for various integrated circuit applications, such as for example, communications, transportation, general computation, or entertainment. Electrical connections are provided to and from the electrical circuitry via the metal layers of interconnect region 14, as discussed above. The substrate of IC wafer 12 may be any type of semiconductor substrate, such as, for example, a silicon substrate, a silicon germanium substrate, a gallium arsenide substrate, a silicon-on-insulator substrate, or any other type of semiconductor-on-insulator substrate.

In the illustrated embodiment, after the final metal layer of interconnect region 14 is formed, a passivation layer 21 is formed over the top surface of semiconductor device 10. In one embodiment, passivation layer 21 includes an oxynitride, such as a plasma oxynitride, and may be formed using conventional processes. An organic layer 22 is formed overlying passivation layer 22. In one embodiment organic layer 22 is a polyimide layer, however, in an alternate embodiment, organic layer 22 may not be present at all. Openings are formed in passivation layer 21 and organic layer 22, if present, to expose metal portions 20, 18, and 16 to allow for electrical contacts, such as between semiconductor device 10 and another device, such as via a robust metal layer.

Still referring to FIG. 1, a robust metal layer having robust metal portions is formed. In one embodiment, a metal seed layer is formed overlying organic layer 22 and patterned such that a portion of the metal seed layer contacts each of exposed metal portions 20, 18, and 16 of IC wafer 12. A metal may then be electroplated onto the seed layer to form robust metal portions 24, 26, and 28 of the robust metal layer. Therefore, each robust metal portion 24, 26, and 28 provides an electrical connection to exposed metal portions (or contacts) 20, 18, and 16, respectively, which, as discussed above, provide electrical connections to the electrical circuits within IC wafer 12.

In one embodiment, robust metal layer is a power metal layer, such as, for example, a power copper layer, which is used to route and supply power, ground or signals to the electrical circuits within IC wafer 12. In this embodiment, the robust metal layer may be formed sufficiently thick to be capable of carrying large currents. For example, in one embodiment, a power copper layer is sufficiently thick to carry at least 15 Amps of current, or at least 20 Amps of current, or even larger currents. Robust metal layer may be formed using various conductive metals, such as, for example, copper or gold. In one embodiment, robust metal layer is sufficiently thick to sustain probing with probe needles without damage. That is, even after probing, robust metal portions 24, 26, and 28 are still in good enough condition to be used as landing pads, as will be described in more detail below. Also, sufficient thickness of robust metal layer may be used to prevent complete consumption of robust metal layer by solder to form an intermetallic alloy which affects mechanical strength. (In one embodiment, the robust metal layer is thick enough to survive corrosive effects during the lifespan of products.) Therefore, in one embodiment, robust metal layer is at least 4 microns thick. Alternatively, robust metal layer may be targeted to be within a range of approximately 8 to 16 microns, or, alternatively, approximately 8+/−4 microns to 16+/−4 microns. Therefore, depending on the design of semiconductor device 10, the thickness of robust metal layer may be sufficient to sustain probing or to carry larger currents (e.g. 20 Amps) or both, as will be described in more detail below.

Referring to FIG. 1, note that robust metal portions 26 and 28 are formed mainly over exposed metal portions 18 and 16 while metal portion 24 is formed over exposed metal portion 20 and laterally extends further to the right of exposed metal portion 20 over organic layer 22 as compared to robust metal portions 26 and 28. Therefore, robust metal layer may be formed in a variety of different ways to provide electrical connections to the final metal layer of IC wafer 12. This ability to spatially redistribute the robust metal portions of the robust metal layer may, in one embodiment, be used to allow for improved alignment when, for example, a second device is coupled to semiconductor device 10. (This ability may also allow for improved robustness, as will be described below.) Also, note that robust metal portions 24, 26, and 28 overlay at least a portion of passivation layer 21 and organic layer 22 (if present). Therefore, the robust metal layer can be useful for routing, as required, to properly connect two disparate semiconductor devices.

Figure 2:
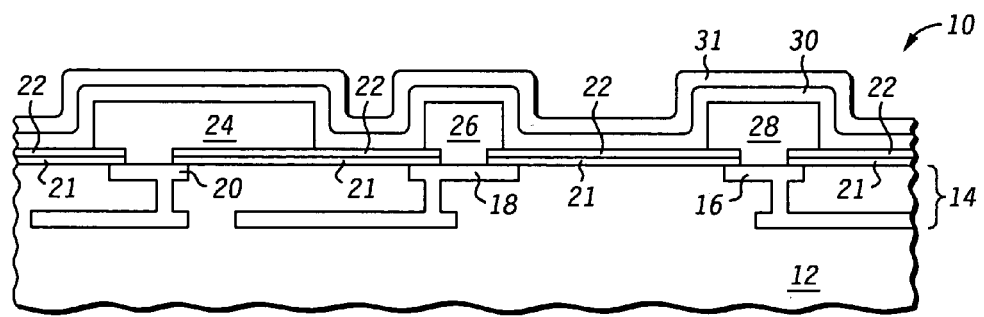
FIG. 2 illustrates a cross-sectional view of the semiconductor device of FIG. 1 after formation of a sputterable nonwettable refractory metal overlying the passivation layer, a metal layer overlying the nonwettable refractory metal, and a robust metal layer in accordance with one embodiment of the present invention.

FIG. 2 illustrates semiconductor device 10 after formation of a nonwettable refractory metal layer 30 overlying organic layer 22 and robust metal portions 24, 26, and 28, and a metal layer 31 overlying nonwettable refractory metal layer 30. In one embodiment, nonwettable refractory metal layer 30 is sputtered onto IC wafer 12, over organic layer 22 (or passivation layer 21 if organic layer 22 is not present) and robust metal portions 24, 26, and 28, and metal layer 31 is sputtered onto IC wafer 12 over nonwettable refractory metal layer 30. In one embodiment, metal layer 31 is a thin copper layer used to promote adhesion of photoresist (as will be described below in reference to FIG. 3). In one embodiment, metal layer 31 is less than 500 nm. (Alternatively, other materials may be used for metal layer 31, additional layers may be used, or metal layer 31 may not be present.) In one embodiment, the sputterable nonwettable refractory metal is titanium tungsten (TiW). For example, TiW may be used over the robust metal layer when it is formed of copper since it is harder and more oxidation resistant than copper. That is, the oxide which forms on TiW is typically thin and easily scratched through when probing. However, in alternate embodiments, other sputterable nonwettable refractory metals may be used, such as, for example, titanium-containing metals (e.g. titanium nitride (TiN), titanium tungsten nitride (TiWN)), aluminum-containing metals, tungsten-containing metals, chromium-containing metals, etc.

Nonwettable refractory metal layer 30 may also be referred to as a solder mask layer since this nonwettable (i.e. non-solderable) metal will be used as a solder mask for the landing pads formed from metal portions 24, 26, and 28, as will be described in reference to subsequent figures below. In one embodiment, nonwettable refractory metal layer 30 is thin, for example, less than 300 nm. Therefore, in one embodiment, the ability to sputter the nonwettable refractory metal layer allows for a thin solder mask layer. Note that since semiconductor device 10 may be one device within a wafer of devices (such as IC wafer 12), the pitch of electrical connections to robust metal portions 24, 26, and 28 is small, e.g. less than 30 microns. Therefore, a sufficiently thin solder mask layer which allows for the finer pitch may be needed, which, in one embodiment, may be accomplished by thin film sputtering.

Note that in one embodiment, the same metal seed layer employed under the robust metal layer is reused as a solder mask over the same robust metal layer. (For example, the metal seed layer and solder mask layer may both be TiW/copper.) Having the same sputtered on metal process serving both as metal seed and as solder mask simplifies manufacturing. Also, refractory metal is generally both hard and electrically conductive. Therefore, in one embodiment, probing on the solder mask (e.g. nonwettable refractory metal layer 30) is generally superior to probing directly on a robust metal layer formed of copper which is generally softer and naturally forms thick oxide layer that hinders probing after extended exposure to an oxidizing atmosphere.

Figure 3:
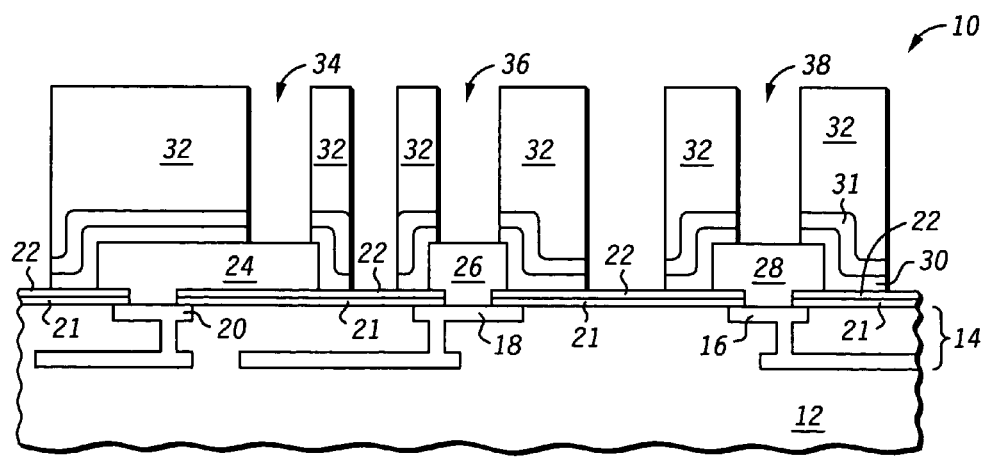
FIG. 3 illustrates a cross-sectional view of the semiconductor device of FIG. 2 having a patterned masking layer in accordance with one embodiment of the present invention.

FIG. 3 illustrates semiconductor device 10 after formation of a patterned masking layer 32 and landing pads 34, 36, and 38. A masking layer 32 is formed overlying metal layer 31 and patterned. In one embodiment, metal layer 31 is an adhesion layer which promotes adhesion of masking layer 32, which may, for example, be a photoresist layer. The exposed portions of nonwettable refractory metal layer 30 and metal layer 31 may then be removed or etched to expose underlying portions of the robust metal layer (to form landing pads 34, 36, and 38) and organic layer 22 (to electrically isolated landing pads 34, 36, and 38 from each other). In one embodiment, masking layer 32 is formed and patterned using conventional processes. In the illustrated embodiment, masking layer 32 is patterned to expose portions of robust metal portions 24, 26, and 28, and to electrically isolate robust metal portions 24, 26, and 28 from each other.

Figure 4:
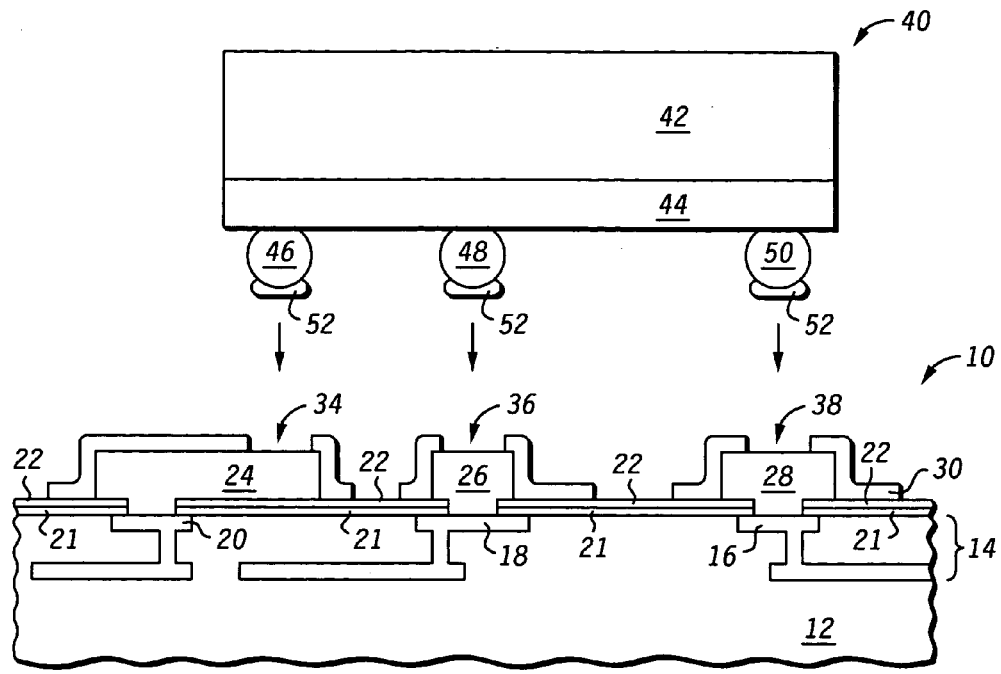
FIG. 4 illustrates a cross-sectional view of the semiconductor device of FIG. 3 after removal of the patterned masking layer and having a second device positioned to be coupled to the semiconductor device in accordance with one embodiment of the present invention.

FIG. 4 illustrates semiconductor device 10 after removal of patterned masking layer 32. In the illustrated embodiment, a clean is performed after removal of pattern masking layer 32 which removes metal layer 31, too. For example, in one embodiment, a copper clean is used which includes an oxygen plasma ash and a dilute sulfuric dip. Also, a microetch may be performed to reclean landing pads 34, 36, and 38 before further assembly. Therefore, as described above, semiconductor device 10 includes landing pads 34, 36, and 38 formed directly from robust metal portions 24, 26, and 28, respectively. Note that in one embodiment, no additional layer is needed over landing pads 34, 36, and 38 to electrically connect to another device.

FIG. 4 also illustrates a second device 40 positioned over semiconductor device 10. Second device 40 includes a device substrate 42 having functional circuitry 44 formed in a first surface of second device 40. Second device 40 may be any kind of device (or chip) such as, for example, an integrated circuit die, a microelectro-mechanical system (MEMS) device, a compound semiconductor device, a memory device, a discrete power device, integrated passives, opto devices, etc. Therefore, functional circuitry 44 may include any type of circuitry to perform a variety of different functions.

Solder balls 46, 48, and 50 are formed on the first surface of second device 40 to provide electrical connections to functional circuitry 44. For example, as known in the art, solder balls 46, 48, and 50 may provide electrical connections via an interconnect region (similar, for example, to interconnect region 14 of IC wafer 12) to the electrical component or components within functional circuitry 44. Therefore, in one embodiment, solder balls 46, 48, and 50 may be formed using conventional processes. In one embodiment, the solder balls are high temperature solder balls such as lead free Tin-copper solder balls, or tin-copper-silver solder balls. In one embodiment (not shown), the solder balls may include a copper stud or standoff. In an alternate embodiment, solder balls 46, 48, and 50 may be formed on landing pads similar to landing pads 34, 36, and 38. That is, in one embodiment, second device 40 may have solder balls 46, 48, and 50 formed on a robust metal layer, as was described above in reference to semiconductor device 10.

In one embodiment, the between-chip solder material (e.g. solder balls 46, 48, and 50) may be formed of a material that is selected to have a high melting point. The high melting point may be selected to be not substantially less than an expected peak of temperature reflow during package mounting on boards. For example, the solder material may be selected to have a melting point within 20 degrees Celsius of a package mounting solder alloy. In one embodiment, the package mounting solder melting point is 230 degrees Celsius, and the between-chip solder material is selected to have a melting point of at least 210 degrees Celsius. The solder material is typically lead free rather than eutectic tin-lead. Eutectic SnPb solder has a melting point of about 182 degrees Celsius. Therefore, although such solder can be used, it may not be as desirable because sustained heat during after-packaging board assembly may remelt the solder material.

Still referring to FIG. 4, second device 40 is dipped in a flux paste such that each solder ball 46, 48, and 50 includes some flux 52 on its tips. Therefore, a flux paste may be selected based on the solder used for solder balls. Furthermore, the flux paste may be a no-clean flux paste that is sufficiently tacky such that a portion of flux (e.g. flux 52) remains on the solder balls when dipped into the paste. (Note that in alternate embodiments, other solder structures rather than the solder balls and flux of FIG. 4 may be used.) Second device 40 is then aligned over semiconductor device 10 for placement such that solder balls 46, 48, and 50 are aligned with landing pads 34, 36, and 38. In one embodiment, a pick and place tool may be used to align and place second device 40 onto semiconductor device 10 of wafer 12.

Figure 5:
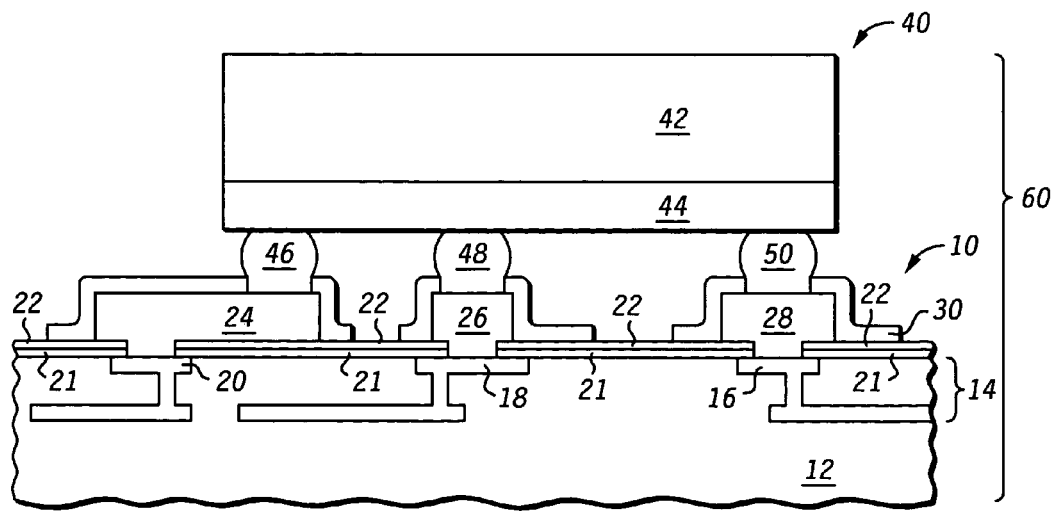
FIG. 5 illustrates a cross-sectional view of the semiconductor device and the second device of FIG. 4 after attachment and reflow, in accordance with one embodiment of the present invention.

FIG. 5 illustrates a device assembly 60 including semiconductor device 10 and second device 40, after second device 40 is attached to semiconductor device 10. In the illustrated embodiment, second device 40 is placed in contact with semiconductor device 10 such that solder balls 46, 48, and 50 contact landing pads 34, 36, and 38, respectively, with flux 52. Device assembly 60 may then be reflowed. During reflow, the solder remains contained within landing pads 34, 36, and 38 due to nonwettable refractory metal layer 30 which forms a solder mask for each of landing pads 34, 36, and 38.

Therefore, it can now be seen how, in one embodiment, a robust metal layer, such as, for example, a power copper layer, may be used to form landing pads which provide electrical connections to a second device. Also note that in one embodiment, the robust metal portions may be used as test probe pads on semiconductor device 10 in order to test semiconductor device 40 separately if needed. Furthermore, note that in one embodiment, no underfill is needed. Also, smaller solder bumps 46, 48, and 50 may be used since, in one embodiment, the coefficient of thermal expansion between second device 40 and semiconductor device 10 is the same because they may be formed of the same materials.

As described above, robust metal portion 24 is spatially redistributed such that landing pad 34 is not aligned with metal portion 20, unlike landing pads 36 and 38 which are generally aligned with metal portions 18 and 16, respectively. This redistribution attribute of the robust metal layer allows for connectivity with a second device, such as, second device 40. For example, without spatial redistribution of robust metal portion 24, a landing pad corresponding to metal portion 20 would not be able to receive solder ball 46. Therefore, the robust metal layer may be formed as needed to provide appropriate landing pads for subsequent coupling to a second device. Also, the spatial redistribution may allow for an improved mechanical connection. For example, referring to FIG. 4, because organic layer 22 (which may be, for example, a polyimide layer) provides for a softer cushion, robust metal portion 24 may be more robust than robust metal portions 26 and 28 because robust metal portion 24 has more of a cushion beneath it (i.e. robust metal portion 24 has a larger area of underlying organic layer 22 as compared to robust metal portions 26 and 28). If a robust metal portion is directly over an aluminum pad, for example, rather than spatially redistributed, the robust metal portion may be weaker in design as impact stress during flip-chip assembly may be more likely to damage active devices under the bond pads. Therefore, in one embodiment, a majority of the robust metal layer includes spatially redistributed metal portions, such as robust metal portion 24, wherein only a few of the robust metal portions are located directly over exposed metal locations such as exposed metal portions 20, 18, or 16.

Also, the use of a robust metal layer (such as, for example, a robust copper metal layer) may prevent the need for an additional under-bump metallurgy (UBM) such as a Ni/Au. That is, in one embodiment, the robust metal layer is sufficiently thick so that additional UBM and bump contact process is unnecessary. (Although some embodiments may still include a UBM to improve solderability.) UBM is typically added to avoid over-diffusion of the solder into the metal layer, but sufficient thickness of the robust metal layer may prevent the metal layer from being over-diffused or consumed by the solder. In this embodiment, no additional UBM is needed as the robust metal is solderable and sufficiently thick. Electroless gold or Sn plating may be applied over the robust metal layer (such as over a copper robust metal layer), if desired, to enhance solderability.

The thickness of the robust metal layer, as discussed above, may be selected so that the robust metal layer can carry sufficient power current (such as, for example, 20 amps) without overheating, electromigration, or other side effects. The thickness may also be selected to withstand corrosion effects. In one embodiment, the thickness of the robust metal layer is selected to withstand impact damage. Types of impact damage include, for example, probing impact damage and flip-chip assembly impact damage. Therefore, the thickness of the robust metal layer may be selected so as to aid in preventing such assembly damage. Thus, the thickness of the robust metal layer may be selected for a variety of reasons, as described above, or for any combination of those or other reasons. Also, placing the robust metal layer over a cushion of polyimide (such as for example, organic layer 22) may minimize the damaging effect of thick film stress and also flip-chip impact damage during high-speed assemblies.

Figure 6:
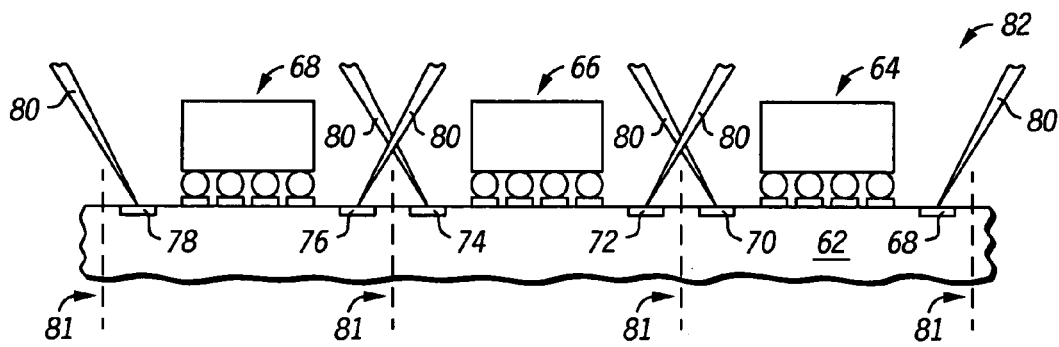
FIG. 6 illustrates a cross-sectional view of a plurality of semiconductor devices coupled to a semiconductor wafer, in accordance with one embodiment of the present invention.

FIG. 6 illustrates a wafer assembly 82. Wafer assembly 82 includes a semiconductor wafer 62 having a plurality of semiconductor devices, each coupled to a corresponding second device to form device assemblies 68, 66, and 64. Note that each of device assemblies 68, 66, and 64 may be like device assembly 60 described above in reference to FIG. 5. Therefore, landing pads, like landing pads 34, 36, and 38 may be formed for each semiconductor device within wafer 62. A second device (like second device 40) may then be coupled to each of the semiconductor devices within wafer 62 to form device assemblies 68, 66, and 64.

Note that semiconductor wafer 62 also includes contacts 78, 76, 74, 72, 70, and 68, where contacts 78 and 76 correspond to device assembly 68, contacts 74 and 72 correspond to device assembly 66, and contacts 70 and 68 correspond to device assembly 64. These contacts may be used as probe sites where probe tips may be placed on these contacts (as illustrated in FIG. 6 with probe tips 80) in order to electrically test each of the device assemblies 68, 66, and 64. In one embodiment, contacts 78, 76, 74, 72, 70 and 68 are similar but larger than contacts 20, 18 and 16 of FIG. 1. Also, in one embodiment, contacts 78, 76, 74, 72, 70 and 68 allow for both wafer probing and later wirebonding. Therefore, note that since each of the second devices are fully electrically connected to the devices of wafer 62 to form fully electrically operational device assemblies 68, 66, and 64, these device assemblies can be probed in order to test the device assemblies. These contacts may then also be used to provide electrical contacts to a package substrate upon singulation and packaging. Singulation includes dicing of device assemblies 68, 66 and 64 from wafer 62 along scribe or saw lines 81.

Although FIG. 6 show 3 full device assemblies 68, 66 and 64, normal sized wafers allow hundreds and often thousands of such assemblies on one wafer. (Note that the contacts, such as contacts 78, 76, 74, 72, 70, and 68, may be used to test the full device assemblies or to test the devices of wafer 62 and then allow wirebonding.) In alternate embodiments, additional contacts created with the robust metal layer on wafer 62 (not shown in the figures) are incorporated to enhance probing of full device assemblies or to allow independent probing of the top devices of assemblies. In one embodiment, these extended robust metal contacts are for probing only and not suitable to provide electrical contacts to a package substrate through wirebonding.

Figure 7:
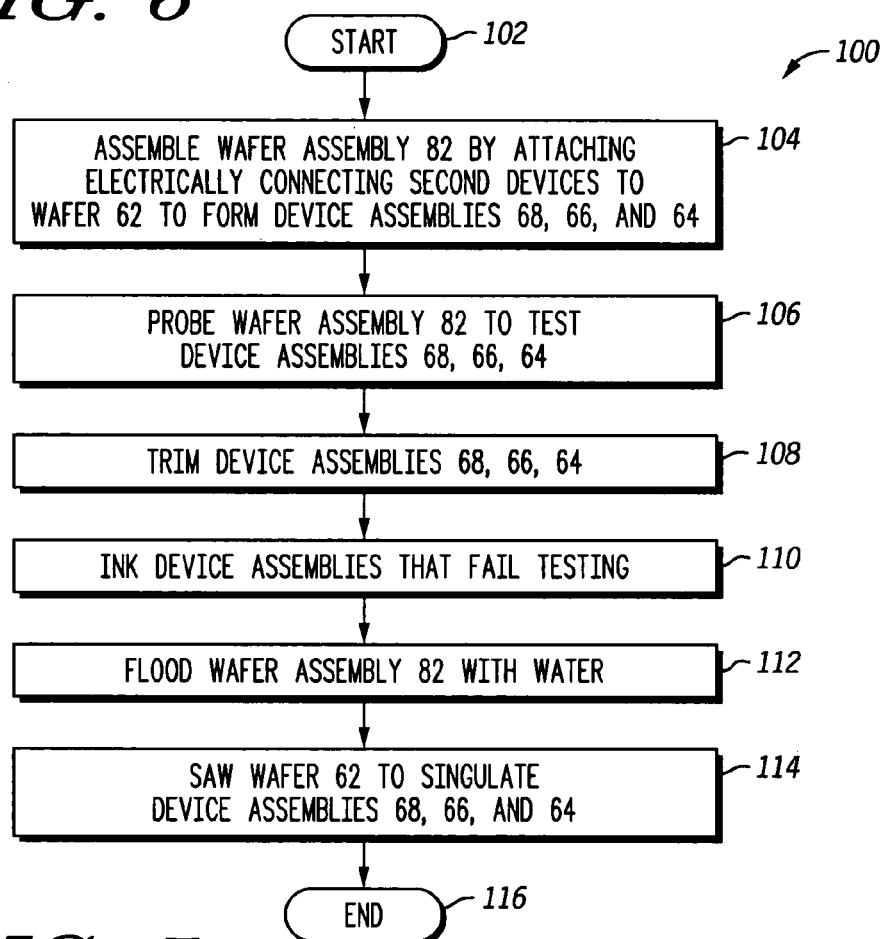
FIG. 7 illustrates a process flow in accordance with one embodiment of the present invention.

FIG. 7 illustrates a sample flow 100 which may be performed with wafer assembly 82, in accordance with one embodiment of the present invention. Flow 100 begins with start 102. Prior to proceeding to block 104, additional steps may be performed. For example, wafer unit probing, wafer thinning, wafer back-side etching, and wafer back-metal, when required, are processed before wafer assembly in block 104. Unit probing of bottom semiconductor devices before assembly allows the exclusion of all defective devices from receiving a secondary device (such as secondary device 40 of FIG. 4.) Wafer thinning, wafer back-side etching, and wafer back-metal deposition may be processed on wafer 12 of FIG. 4 before assembly of second device 40. These operations are not always necessary but may help wafer fabs to gauge their fab yield and to reduce assembly cost. These process steps are known in the art and therefore will not be discussed in more details herein. Flow then proceeds to block 104 where wafer assembly 82 is assembled by attaching and electrically connecting second devices to wafer 62 to form device assemblies 68, 66, and 64 of wafer assembly 82, as was described above in reference to FIGS. 1–6.

Flow then proceeds to block 106 where wafer assembly 82 is probed. For example, probing may include probing contacts 78 and 76 to test assembly 68, then 74 and 72 to test assembly 66, then 70 and 68 to test assembly 64, as illustrated in FIG. 6, with probe tips 80 moving sequentially to test device assemblies 68, 66, and 64. Alternatively, device assemblies 68, 66, and 64 may be probed and tested in parallel. Note, as discussed above, that the electrical operation of each of the full device assembly systems may be probe tested while still in wafer form. A conventional probe tester may therefore be used to perform the probe tests. Flow then proceeds to block 108 where device assemblies 68, 66, and 64 may be trimmed, if desired. For example, trimming may include changing resistor values or cutting out redundant circuitry, as known in the art. Wafer level burn-in can also be employed on entire assembly before packaging. Flow then proceeds to block 110 where device assemblies which fail testing may be inked to mark that they failed.

Flow then proceeds to block 112 where wafer assembly 82 is flooded with water, such as, for example, deionized water. This may help minimize silicon dust from getting between wafer 62 and the second devices during subsequent sawing to singulate the device assemblies. Flow then proceeds to block 114 where wafer 62 is sawed (such as, for example, along saw lines 81) to singulate device assemblies 68, 66, and 64. Each singulated device assembly can then be individually packaged into any type of semiconductor packaging. For example, during packaging, the contacts 78, 76, 74, 72, 70, and 68 can be wire bonded to a package substrate. The device assemblies can be packaged, for example, into a Quad-flat no-lead (QFN) package, a ball-grid array (BGA) package, or any other type of package. Flow then ends at end 116.

Figure 8:
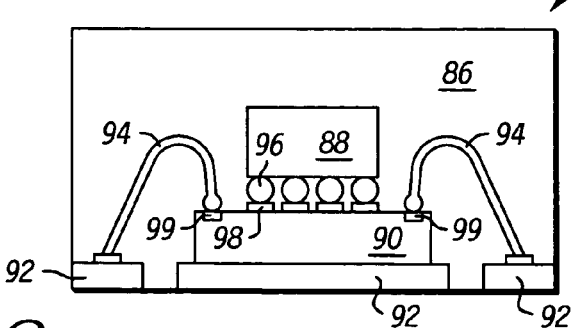
FIG. 8 illustrates a cross-sectional view of a multiple device package in accordance with one embodiment of the present invention.

FIG. 8 illustrates a multiple device QFN package 84 in accordance with one embodiment of the present invention. Package 84 includes a QFN package substrate 92 having a first device 90 overlying package substrate 92 (which may also referred to as a lead frame) and a second device 88 overlying and electrically coupled to first device 90 via solder balls 96 and landing pads 98. Therefore, note that first device 90 and second device 88 may correspond to a device assembly, such as device assembly 60 of FIG. 5, where landing pads 98 may be formed like landing pads 34, 36, and 38. Therefore, first device 90 may correspond to the semiconductor device 10 within IC wafer 12, and second device 88 may correspond to second device 40 of FIG. 5. Package 84 may also include electrical connections from a surface of first device 90 to package substrate 92. For example, in one embodiment, package 84 includes wire bonds 94 to electrically couple first device 90 from bond pads 99 to package substrate 92, as known in the art. Also, package 84 may include a mold compound 86 surrounding devices 88 and 90 and wire bonds 94 to form a complete package 84. Mold compound 86 may be formed as known in the art using materials as known in the art. Mold compound 86 may also be referred to as an encapsulant or may be a glob top, as known in the art. In one embodiment, this same mold compound 86 also flows and naturally fills the narrow gap between devices 90 and 88; this mechanism is underfilling, as known in the art. In one embodiment, special underfilling mold compounds may be employed. However, in alternate embodiments, special underfilling materials may not be necessary to achieve suitable reliability because devices 90 and 88 match closely in their material coefficients of thermal expansion. Also, mechanical stress on bumps 96 is generally minimal and special underfill step may therefore not be required.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method comprising:
   providing an integrated circuit wafer including a plurality of integrated circuits and a metal layer disposed over each integrated circuit, and a plurality of test probe locations;
   forming device landing pads at selected locations of the metal layer to provide locations for electrically coupling each integrated circuit to a corresponding semiconductor device;
   electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer;
   testing each device assembly by contacting test probe locations corresponding to each device assembly with a wafer test probe; and
   identifying each device assembly which passes testing.

2. The method of claim 1 further comprising:
   trimming each device assembly as necessary after testing each device assembly.

3. The method of claim 1 further comprising:
   singulating the device assemblies; and
   discarding device assemblies identified as having failed testing.

4. The method of claim 3 further comprising:
   packaging the device assemblies which do not fail testing after discarding the device assemblies identified as having failed testing.

5. The method of claim 1 further comprising:
   singulating the device assemblies after testing each device assembly.

6. The method of claim 1 wherein the step of providing the integrated circuit comprises:
   providing an integrated circuit wafer including a plurality of integrated circuits, each integrated circuit including a final metal circuit interconnect layer of a plurality of metal circuit interconnect layers;
   forming a passivation layer over the final metal circuit interconnect layer, the passivation layer not overlying portions of the final metal circuit interconnect layer; and
   forming the metal layer over portions of the passivation layer.

7. The method of claim 1, wherein the test probe locations may be used as wire bond locations.

8. A method comprising:
   providing an integrated circuit wafer including a plurality of integrated circuits and a metal layer disposed over each integrated circuit, and a plurality of test probe locations;
   forming device landing pads at selected locations of the metal layer to provide locations for electrically coupling each integrated circuit to a corresponding semiconductor device; and
   electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer;
   wherein the providing the integrated circuit comprises:
      providing the integrated circuit wafer including the plurality of integrated circuits, each integrated circuit including a final metal circuit interconnect layer of a plurality of metal circuit interconnect layers;
      forming a passivation layer over the final metal circuit interconnect layer, the passivation layer not overlying portions of the final metal circuit interconnect layer;
      forming the metal layer over portions of the passivation layer; and
      forming an organic layer over the passivation layer before forming the metal layer.

9. A method comprising:
   providing an integrated circuit wafer including a plurality of integrated circuits and a metal layer disposed over each integrated circuit, and a plurality of test probe locations;

forming device landing pads at selected locations of the metal layer to provide locations for electrically coupling each integrated circuit to a corresponding semiconductor device; and electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer;

wherein the providing the integrated circuit comprises:
  providing the integrated circuit wafer including the plurality of integrated circuits, each integrated circuit including a final metal circuit interconnect layer of a plurality of metal circuit interconnect layers;
  forming a passivation layer over the final metal circuit interconnect layer, the passivation layer not overlying portions of the final metal circuit interconnect layer; and
  forming the metal layer over portions of the passivation layer, wherein the forming the metal layer comprises:
    forming a seed metal layer;
    patterning the seed metal layer; and
    electroplating a second metal on the patterned seed metal layer.

10. The apparatus of claim 9 wherein the second metal is electroplated to a thickness selected to account for at least one of providing a sufficient diffusion bulk characteristic to the second metal, providing power current carrying capability to the second metal, providing bulk for corrosion effect survivability, and minimizing assembly impact damage while still being capable of carrying electric currents to sustain electrical communication between a corresponding integrated circuit and semiconductor device.

11. The apparatus of claim 9 wherein the electroplating is controlled to form a thickness of the second metal within a range from 8 microns to 16 microns with an acceptable thickness variation of plus or minus 4 microns.

12. A method comprising:
  providing an integrated circuit wafer including a plurality of integrated circuits and a metal layer disposed over each integrated circuit, and a plurality or test probe locations;
  forming device landing pads at selected locations of the metal layer to provide locations for electrically coupling each integrated circuit to a corresponding semiconductor device; and
  electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer;
  wherein the providing the integrated circuit comprises:
    providing the integrated circuit wafer including the plurality of integrated circuits, each integrated circuit including a final metal circuit interconnect layer of a plurality of metal circuit interconnect layers;
    forming a passivation layer over the final metal circuit interconnect layer, the passivation layer not overlying portions of the final metal circuit interconnect layer; and
    forming the metal layer over portions of the passivation layer, wherein the forming the metal layer comprises patterning the metal layer to spatially redistribute contact locations.

13. A method comprising:
  providing an integrated circuit wafer including a plurality of integrated circuits and a metal layer disposed over each integrated circuit, and a plurality of test probe locations;
  forming device landing pads at selected locations of the metal layer to provide locations for electrically coupling each integrated circuit to a corresponding semiconductor device;
  electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer;
  wherein the providing the integrated circuit comprises:
    providing the integrated circuit wafer including the plurality of integrated circuits, each integrated circuit including a final metal circuit interconnect layer of a plurality of metal circuit interconnect layers;
    forming a passivation layer over the final metal circuit interconnect layer, the passivation layer not overlying portions of the final metal circuit interconnect layer; and
    forming the metal layer over portions of the passivation layer; and
  wherein the forming the device landing pads comprises:
    forming a solder mask layer over the passivation and metal layers;
    forming a masking layer over the solder mask layer, the masking layer being patterned to expose landing pad locations;
    removing portions of the solder mask layer exposed by the masking layer; and
    removing the masking layer.

14. The method of claim 13 wherein the step of forming the solder mask layer comprises:
  sputtering a nonwettable refractory metal layer over the passivation and metal layers.

15. The method of claim 14 wherein the nonwettable refractory metal layer is titanium tungsten.

16. The method of claim 14 wherein the step of removing portions of the solder mask layer comprises:
  etching portions of the refractory metal layer exposed by the masking layer to form electrically isolated landing pads.

17. The method of claim 13 wherein:
  the step of forming the solder mask layer includes sputtering an adhesion promoter coat over the nonwettable refractory metal layer; and
  the step of removing portions of the solder mask layer includes first etching through adhesion promoter coat and then etching portions of the refractory metal layer exposed by the masking layer to form electrically isolated landing pads.

18. A method comprising:
  providing an integrated circuit wafer including a plurality of integrated circuits and a metal layer disposed over each integrated circuit, and a plurality of test probe locations;

forming device landing pads at selected locations of the metal layer to provide locations for electrically coupling each integrated circuit to a corresponding semiconductor device;

electrically coupling a semiconductor device to each integrated circuit via the metal landing pads to provide a plurality of device assemblies, each device assembly including at least one of the integrated circuits and at least one of the semiconductor devices, wherein the test probe locations may be used to test each device assembly while each device assembly is physically coupled to another device assembly by the wafer, wherein the electrically coupling comprises:

providing a semiconductor device for each integrated circuit, each semiconductor device including a wafer substrate with first and second surfaces, each semiconductor device including integrated circuitry proximate to the first surface, each semiconductor device including solder structures on the first surface;

placing each semiconductor device over its corresponding integrated circuit with the first surface disposed proximate to the corresponding integrated circuit;

aligning the solder structures with the landing pads;

placing the solder structures in contact with the landing pads; and reflowing the solder structures.

19. The method of claim 18 wherein the solder structures comprise at least one of solder balls and solder flux paste, and wherein the solder structures comprise a solder material having a melting point not substantially less than an expected peak package mounting reflow temperature.

20. A method comprising:

providing a wafer including a plurality of integrated circuits;

forming a layer of metal over each integrated circuit;

electrically coupling a semiconductor device to each integrated circuit via corresponding metal to provide a plurality of device assemblies, each device assembly including a respective integrated circuit and semiconductor device;

probe testing at least one of the device assemblies while such device assemblies are physically coupled to each other by the wafer.

21. The method of claim 20 wherein the forming the layer of metal over each wafer integrated circuit comprises:

depositing first metal over a first location at a metal landing pad on the integrated circuit; and depositing metal lateral over a second location lateral to the first location to provide a contact point for the semiconductor device at the second location, the second metal being electrically connected to the first metal.

22. The method of claim 21 wherein the depositing the first metal and the depositing the second metal are performed at substantially the same time.

23. The method of claim 20 wherein the forming of the layer of metal layer is performed so that the metal layer has an average thickness of at least 4 microns to eliminate a need for under bump metal.

24. The method of claim 23 wherein the average thickness is targeted to be within a range from 8 microns to 12 microns.

25. The method of claim 20 further comprising marking each device assembly which fails a probe test.

26. The method of claim 25 further comprising singulating the device assemblies after marking any failed device assemblies.

27. The method of claim 26 wherein the step of singulating comprises:

sawing the wafer between the device assemblies to provide a plurality of separated device assemblies.

28. The method of claim 26 further comprising disposing of marked device assemblies.

29. The method of claim 20 further comprising dicing the device assemblies after probe testing.

30. The method of claim 29 further comprising trimming circuitry of the device assemblies after probe testing and before dicing.

* * * * *

UNITED STATES PATENT AND TRADEMARK OFFICE
CERTIFICATE OF CORRECTION

PATENT NO.       : 7,132,303 B2                                          Page 1 of 1
APPLICATION NO.  : 10/739605
DATED            : November 7, 2006
INVENTOR(S)      : James Jen-Ho Wang It is certified that error appears in the above-identified patent and that said Letters Patent is hereby corrected as shown below:

In Column 11, Line 45, Claim No. 12:

Change "a plurality or" to --a plurality of--

Signed and Sealed this

Twentieth Day of May, 2008

JON W. DUDAS
*Director of the United States Patent and Trademark Office*